United States Patent
Maki et al.

[11] Patent Number: 6,081,444
[45] Date of Patent: Jun. 27, 2000

[54] STATIC MEMORY ADOPTING LAYOUT THAT ENABLES MINIMIZATION OF CELL AREA

[75] Inventors: Yasuhiko Maki; Hiroshi Shimizu; Hiroshi Kagiwata, all of Kawasaki, Japan

[73] Assignee: Fujitsu Limited, Kawasaki, Japan

[21] Appl. No.: 09/204,278

[22] Filed: Dec. 3, 1998

[30] Foreign Application Priority Data

Jul. 9, 1998 [JP] Japan ................................. 10-194396

[51] Int. Cl.$^7$ ...................................................... G11C 11/00
[52] U.S. Cl. ............................................. 365/154; 365/174
[58] Field of Search .................................... 365/154, 174; 257/371, 315, 369

[56] References Cited

U.S. PATENT DOCUMENTS

5,247,198  9/1993  Homma et al. ......................... 257/371
5,818,080  10/1998  Kuriyama .............................. 365/154

*Primary Examiner*—David Nelms
*Assistant Examiner*—David Lam
*Attorney, Agent, or Firm*—Armstrong, Westerman, Hattori, McLeland & Naughton

[57] ABSTRACT

A static memory in which memory cells each have the components thereof laid out so that the area of each memory cell can be further reduced in compliance with improvement in technology of separating devices. The static memory includes CMOS memory cells each having two cross-coupled inverters, in each of which an n-channel transistor and p-channel transistor are connected in series with each other. At least one of the contacts used to cross-couple the two inverters is located in a region other than a region enclosed by the diffused sources and drains of the n-channel transistors and p-channel transistors included in the memory cell.

3 Claims, 7 Drawing Sheets

STATIC MEMORY ADOPTING LAYOUT THAT ENABLES MINIMIZATION OF CELL AREA

BACKGROUND OF THE INVENTION

1. Field of the Invention

The present invention relates to a static memory (SRAM) that includes CMOS memory cells each having two cross-coupled inverters, each of which contains an n-channel transistor and p-channel transistor connected in series with each other. More particularly, this invention is concerned with a static memory having the area of each memory cell minimized.

2. Description of the Related Art

A important task concerning memories is to improve the degree of integration. For improving the degree of integration, conceivably, machining is carried out microscopically and novel circuitry is devised. It is also conceivable to devise a layout for minimizing the area of each memory cell. In a highly integrated memory, the degree of integration directly affects cost. Even if the area of each memory cell is decreased by only a few percent, a great effect can be expected.

The circuitry of a memory cell to be employed in a static memory (SRAM) is such that n-channel transistors are connected to a flip-flop (FF) and a pair of bit lines. Herein, the flip-flop is configured by cross-coupling two inverters in each of which an n-channel transistor and p-channel transistor are connected in series with each other. The n-channel transistors working as transfer gates are used for writing or reading.

A minimal spacing X between an n-channel transistor and p-channel transistor is restricted by a manufacturing process and the precision of manufacturing. The minimal spacing X must therefore be set to a correct value. In the past, contact holes, which join a polysilicon layer with a wiring layer and thus cross-couple a pair of inverters, have been centralized between n-channel transistors and p-channel transistors. This was thought to minimize the area of a memory cell.

In recent years, the technology of manufacturing semiconductors has progressed. A necessary minimal width of a device or a necessary minimal spacing between devices can be narrowed compared with a conventionally adopted one. According to a conventional layout, however, the size of a memory cell is not determined with a minimal spacing between an n-channel transistor and p-channel transistor. The size of a memory cell is determined with a spacing necessary to arrange contact holes among n-channel transistors and p-channel transistors. This poses a problem in that even when the technology of separating devices has advanced, the effect of diminishing a memory cell size is not realized.

Moreover, the size of a memory cell is affected by the distance by which a p-channel gate is extended across the channel in order to suppress a leakage current. When memory cells are set in an array, even if a variation in the manufacturing processes increases and the precision in manufacturing improves, the magnitude by which the p-channel gate is extended across the channel is not generally reduced. This leads to a problem in that the size of a memory cell cannot be decreased very much.

SUMMARY OF THE INVENTION

An object of the present invention is to realize a layout of memory cells making it possible to further reduce the area of each memory cell in compliance with an improvement in the technology of separating devices, and to thus minimize the cost of manufacturing by improving the degree of integration of a static memory (SRAM) having CMOS memory cells.

A static memory in accordance with the present invention includes CMOS memory cells each having two inverters in each of which an n-channel transistor and p-channel transistor are connected in series with each other. At least one of the contacts used to cross-couple the two inverters is located in a region other than a region enclosed by the diffused sources and drains of the n-channel transistors and p-channel transistors.

According to the present invention, only one contact hole must be located in the region enclosed with the diffused sources and drains of the n-channel transistors and p-channel transistors. The spacing between the transistors can therefore be set to a minimal spacing as determined by a manufacturing process. Consequently, the area of each memory cell can be minimized.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Before proceeding to a detailed description of the preferred embodiments, a prior art layout of a SRAM will be described with reference to the accompanying drawings for a clearer understanding of the differences between the prior art and the present invention.

Figure 1A:
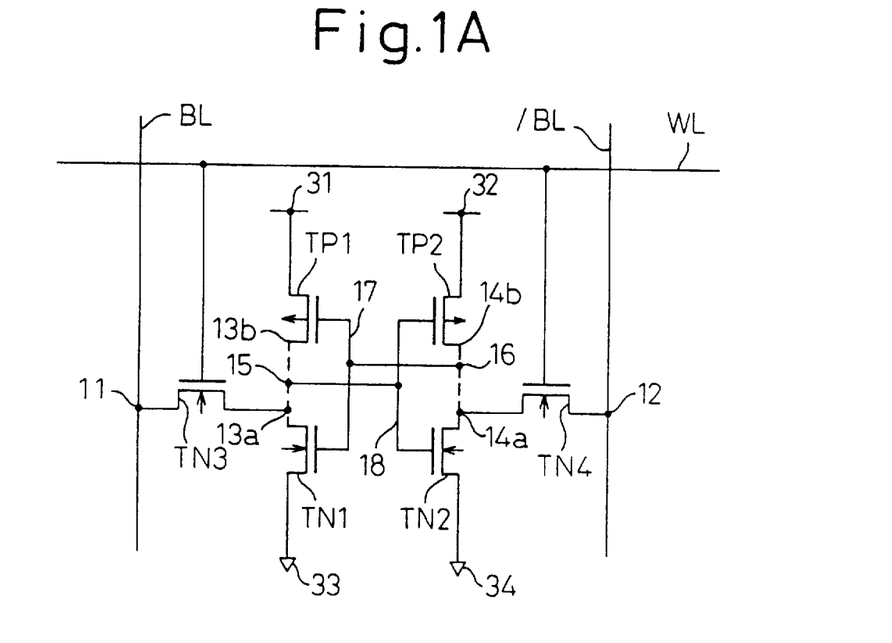
FIG. 1A is a diagram showing the circuitry of a memory cell employed in an SRAM.
Figure 1B:
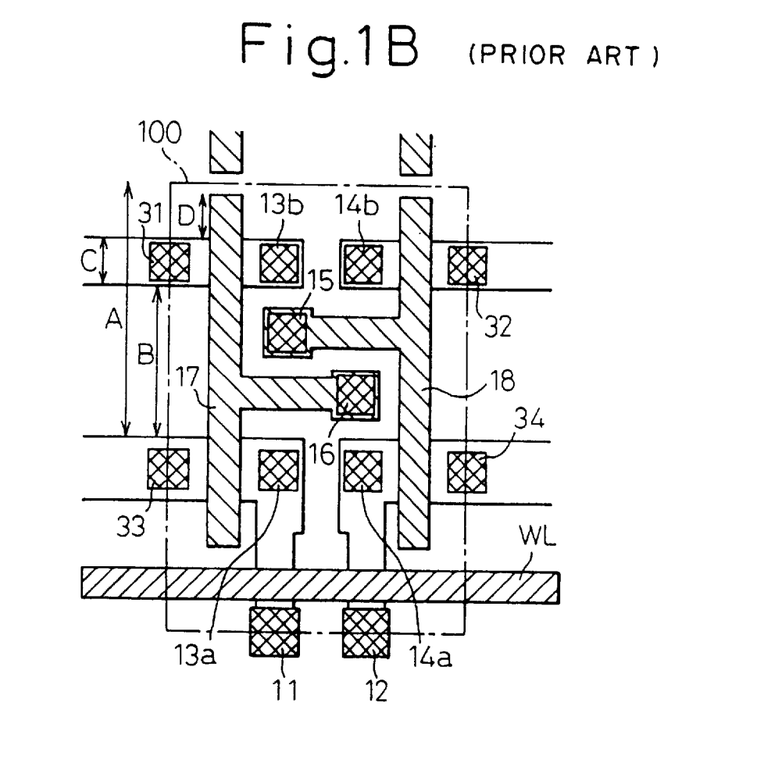
FIG. 1B is a diagram showing an example of a conventional layout.

FIG. 1A is a diagram showing the circuitry of a memory cell employed in a static semiconductor memory (SRAM). FIG. 1B is a diagram showing a conventional layout. The circuitry shown in FIG. 1A is well known. The details of the circuitry will therefore be omitted. Two inverters in each of which an n-channel transistor TN1 or TN2 and p-channel transistor TP1 or TP2 is connected in series with each other are cross-coupled, thus constituting a flip-flop (FF). N-channel transistors TN3 and TN4 working as transfer gates for writing or reading are connected to the inverters and on a pair of bit lines BL and/BL. The gates TN3 and TN4 are connected on a word line WL. Contact holes 15 and 16 are used to cross-couple the two inverters.

Components denoted by reference numerals in the layout of FIG. 1B correspond to those denoted by the same reference numerals in the circuit diagram of FIG. 1A. Contact holes 11 and 12 join the inverters with the bit lines BL and/BL. Contact holes 31 and 32 join the inverters with a power line. Contact holes 33 and 34 join the inverters with a grounding line. Contact holes 13a, 15, and 13b are linked by a wiring layer that is not shown. Contact holes 14a, 16, and 14b are also linked by the wiring layer that is not shown. A diffused layer is formed under a word line WL between the contact holes 11 and 12 and the contact holes 13a and 14a. The n-channel transistors TN3 and TN4 working as transfer gates are thus structured as diffused transistors. The diffused layer is also present under a polysilicon layer 17 extending between the contact holes 13a and 33 and between the contact holes 13b and 31. The n-channel transistor TN1 and p-channel transistor TP1 are thus structured as diffused transistors. Likewise, the diffused layer is present under a polysilicon layer 18 extending between the contact holes 14a and 34 and between the contact holes 14b and 32. The n-channel transistor TN2 and p-channel transistor TP2 are thus structured as diffused transistors. A range that is defined with a dot-dash line in FIG. 1B is the range of one memory cell. In the conventional layout shown in FIG. 1B, these memory cells are juxtaposed in a row direction or a direction in which word lines WL extend. In a column direction (a direction perpendicular to the row direction in which pairs of bit lines extend), the memory cells, and memory cells that are symmetric to the memory cells with respect to the sides of the memory cells extending in the row direction are arranged alternately.

In FIG. 1B, a distance A is the distance from the upper edge of the diffused region of the n-channel transistor TN1 or TN2 to the upper border of the memory cell. A spacing B is the spacing between the n-channel transistor TN1 or TN2 and the p-channel transistor TP1 or TP2. A width C is the width of the diffused region of the p-channel transistor TP1 or TP2. A magnitude of jut D is the magnitude by which a p-channel gate is extended across the channel in order to suppress a leakage current. A minimal spacing X between an n-channel transistor and p-channel transistor is restricted by a manufacturing process and precision in manufacturing. The minimal spacing X must therefore be set to the correct value. Conventionally, the contact holes 15 and 16 used to crosscouple the pair of inverters join the polysilicon layers 17 and 18 with the wiring layer that is not shown. The contact holes 15 and 16 are centralized. Thus, the area of the memory cell is supposed to be minimized.

Figure 2:
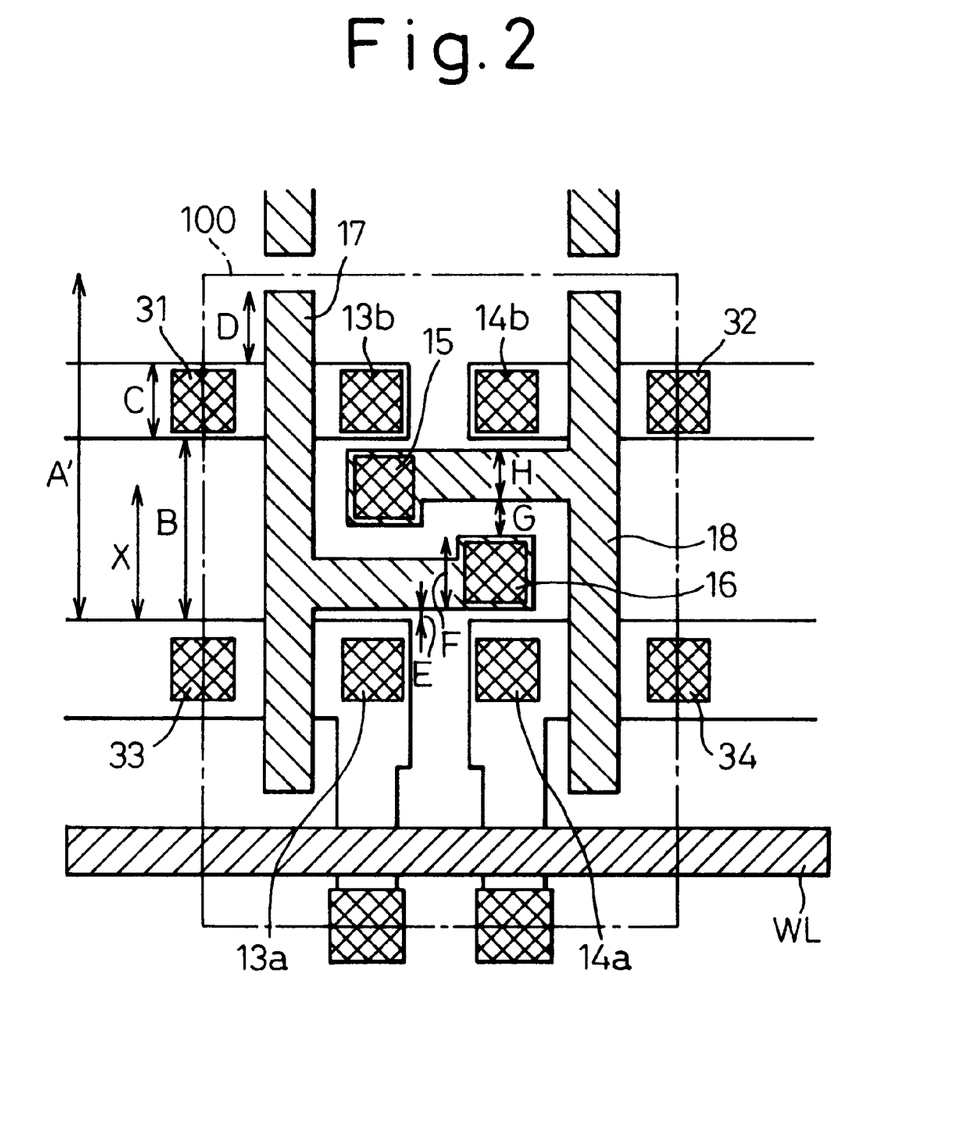
FIG. 2 is a diagram for explaining limitations on the conventional layout accompanying advancement in manufacturing technology.

In recent years, the technology of manufacturing semiconductors has progressed. A necessary minimal width of a device or a necessary minimal spacing between devices can be narrow compared with a conventional device. FIG. 2 is a diagram for explaining an innovation accompanying the progress in technology. FIG. 2 corresponds to FIG. 1B. A spacing B is the spacing between an n-channel transistor and p-channel transistor. A minimal spacing X is the minimal spacing determined with a manufacturing process. A distance E is the minimal necessary distance between the diffused layer and polysilicon layer. A width F is the minimal width of the polysilicon layer necessary to preserve contact holes. A spacing G is the minimal necessary spacing between the polysilicon layers. A width H is the minimal necessary width of the polysilicon layer. Assume that a spacing necessary to centralize the contacts of the polysilicon layers is Y. The spacing Y is calculated as Y=E+F+G+H+E=2E+F+G+H as far as the conventional layout is concerned. Conventionally, a sufficiently wide spacing must be kept between the n-channel transistor and p-channel transistor. When X>Y, B=X. However, when X is decreased with the improvement in technology of separating devices, since X<Y, B=Y. This is the current situation. At this time, the distance between the upper edge of the diffused region of the n-channel transistor and the upper border of the memory cell, A, is A'. A'=Y+C+D+G/2=C+D+2E+F+3G/2+H (expression 1) is established. Specifically, A(A') is not determined with the minimal spacing between the n-channel transistor and p-channel transistor. A(A') is determined with a spacing necessary to arrange the contact holes 15 and 16 among the n-channel transistors and p-channel transistors. When X<Y, as long as the layout shown in FIG. 2 is adopted, the improvement in technology of separating devices does not exert an effect of diminishing a memory cell.

Moreover, as mentioned above, A' is affected by the magnitude of jut D of the p-channel gate necessary to suppress a leakage current. When memory cells are set in an array, even if a variation of manufacturing processes increases and the precision in manufacturing improves, the magnitude of expansion D of the p-channel gate is not generally decreased. Consequently, the size of a memory cell is not reduced very much.

Figure 3:
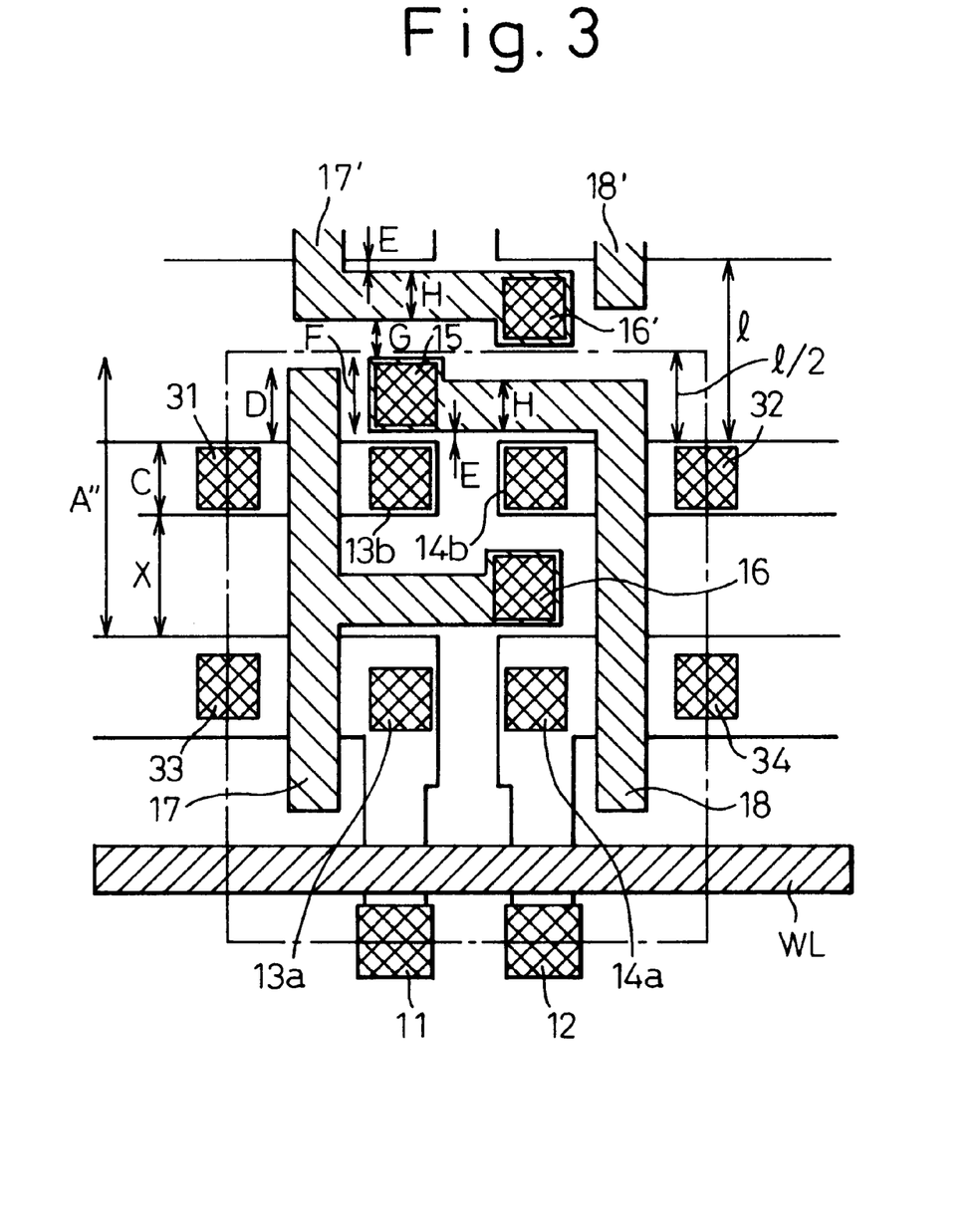
FIG. 3 is a diagram showing a basic layout for a static memory in accordance with the present invention.

FIG. 3 is a diagram showing a basic layout in accordance with the present invention.

As shown in FIG. 3, a static memory in accordance with the present invention includes CMOS memory cells, each having two cross-coupled inverters, in each of which an n-channel transistor and p-channel transistor are connected in series with each other. Herein, the contact holes 15 and 16 are used to cross-couple the two inverters. At least one of the contact holes 15 and 16 is located outside a region enclosed with the diffused sources and drains of the n-channel transistors and p-channel transistors included in each memory cell.

Referring to the layout in accordance with the present invention, a distance A" from the upper edge of the n-channel transistor TN1 or TN2 to the upper border of each memory cell will be described below. In FIG. 3, the reference numerals denoting components of an upper memory cell bear a dash ('). The same applies to the subsequent drawings. According to the present invention, as shown in FIG. 3, only one contact hole 16 must be located in a region enclosed with the diffused sources and drains of n-channel transistors and p-channel transistors. A spacing between the n-channel transistor and p-channel transistor can therefore be set to the minimal spacing X determined by a manufacturing process. At this time, assume that a length between the diffused regions of p-channel transistors in a cell concerned and an upper cell is 1. A"=X+C+1/2 is established. The length 1 differs between when D<E+F and when D>E+F. Assuming that D<E+F is established, 1=E+F+G+H+E. Consequently, A"=X+C+(E+F+G+H+E)/2=X+C+E+F/2+G/2+H/2. When A" is compared with A' in the conventional layout (expression 1), if X<D+E+F/2+G+H/2, A"<A'. This means that the layout in accordance with the present invention can make A smaller. Assuming that D>E+F is established, 1=D+G+H+E. Consequently, A"=X+C+(D+G+H+E)/2=X+C+D/2+E/2+G/2+H/2. When this A" is compared with A' in the conventional layout (expression 1), if X<D/2+3E/2+F+G+H/2, A"<A'. This means that the layout in accordance with the present invention can make A smaller. Owing to the recent improvement in technology of separating devices, X has come to be able to satisfy the above condition. A"<A can be achieved. Namely, the layout in accordance with the present invention can actually make A smaller.

Figure 4:
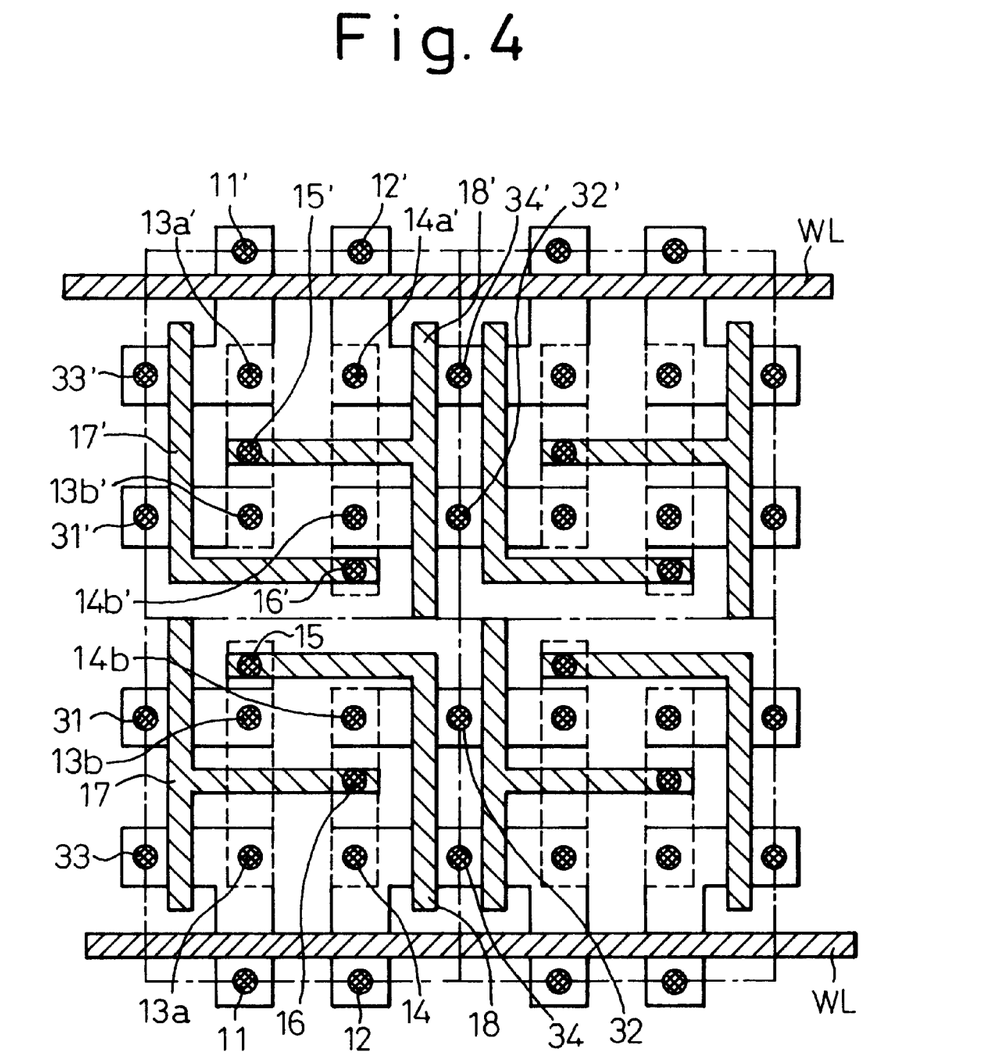
FIG. 4 is a diagram showing a layout for an SRAM in accordance with the first embodiment.

FIG. 4 is a diagram showing a layout for an SRAM in accordance with the first embodiment of the present invention. An array of four memory cells of two memory cells in a row and two memory cells in a column is shown. Moreover, the contact holes are circular. Alternatively, square contact holes like those shown in FIGS. 1B to 3 can be adopted. A wiring layer linking contact holes 13a, 13b, and 15 and also linking contact holes 14a, 14b, and 16 is defined with a dashed line.

In the SRAM of the first embodiment, the memory cells shown in a lower part of FIG. 4 each have components thereof laid out according to the same layout as the foregoing one shown in FIG. 3. The upper memory cells are 180° symmetric to the lower memory cells. The two pairs of upper and lower memory cells are arranged repeatedly in the column direction (direction in which pairs of bit lines extend and which is perpendicular to the word lines WL). The two pairs of upper and lower memory cells are arranged repeatedly along the word lines WL. Consequently, memory cells each having components thereof laid out according to the same layout are arranged successively in the same row.

Figure 5:
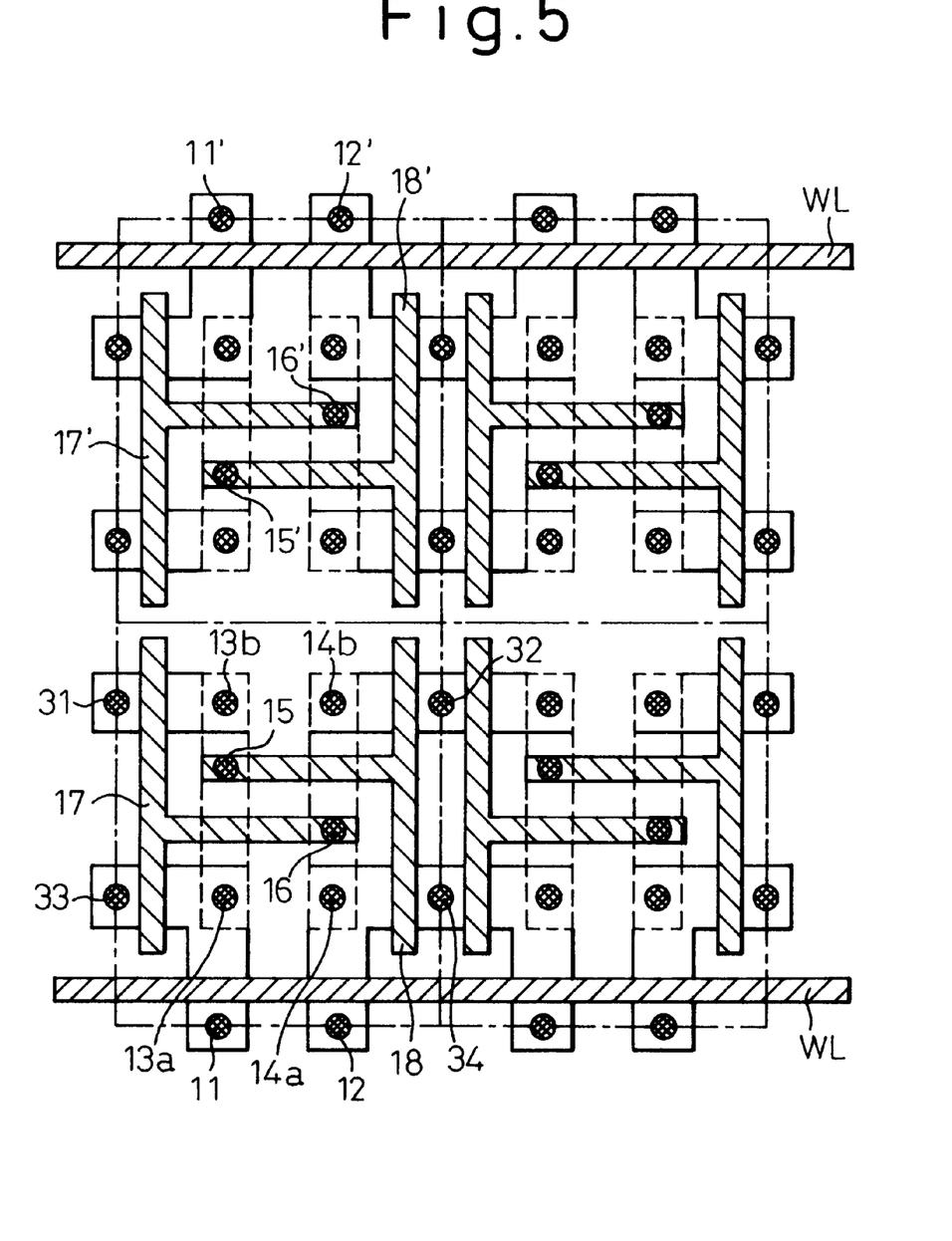
FIG. 5 is a diagram showing a layout for an SRAM in accordance with a prior art.

For comparison with a prior art, FIG. 5 shows an example of a layout in accordance with the prior art. In the prior art, memory cells arranged in a lower row each have components thereof laid out according to the layout shown in FIGS. 1B and 2. Memory cells arranged in an upper row each have components thereof laid out so that the components will be symmetric to the components of each lower memory cell with respect to the side of the lower memory cell parallel to the word lines WL.

Figure 6:
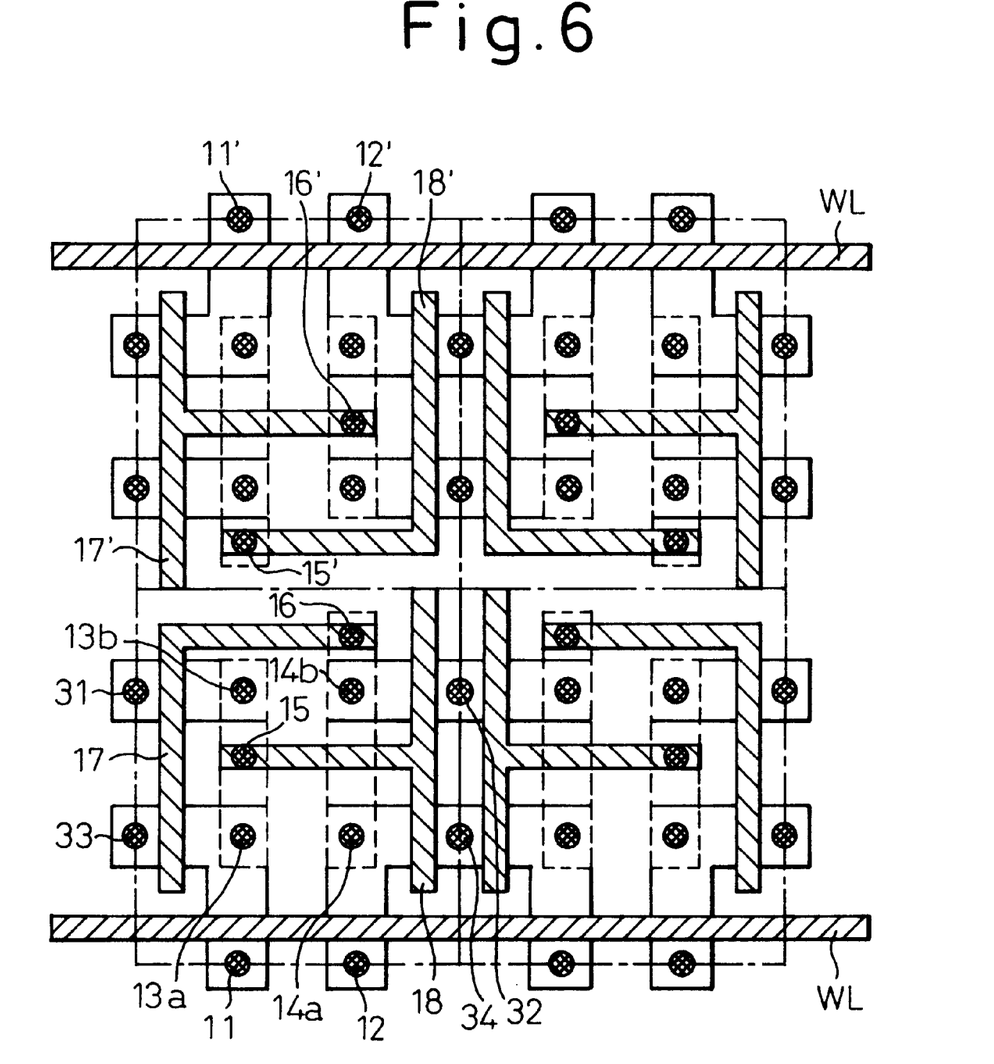
FIG. 6 is a diagram showing a layout for an SRAM in accordance with the second embodiment.

FIG. 6 is a diagram showing a layout for an SRAM in accordance with the second embodiment of the present invention. As illustrated, the layout for two right-hand memory cells in FIG. 6 is identical to the one for the two upper and lower memory cells in FIG. 4. The layout for two left-hand memory cells and the layout for two right-hand memory cells are mutually symmetric with respect to a straight line passing through contact holes 32 and 34. Even this layout provides the same advantages as that of the first embodiment.

Figure 7:
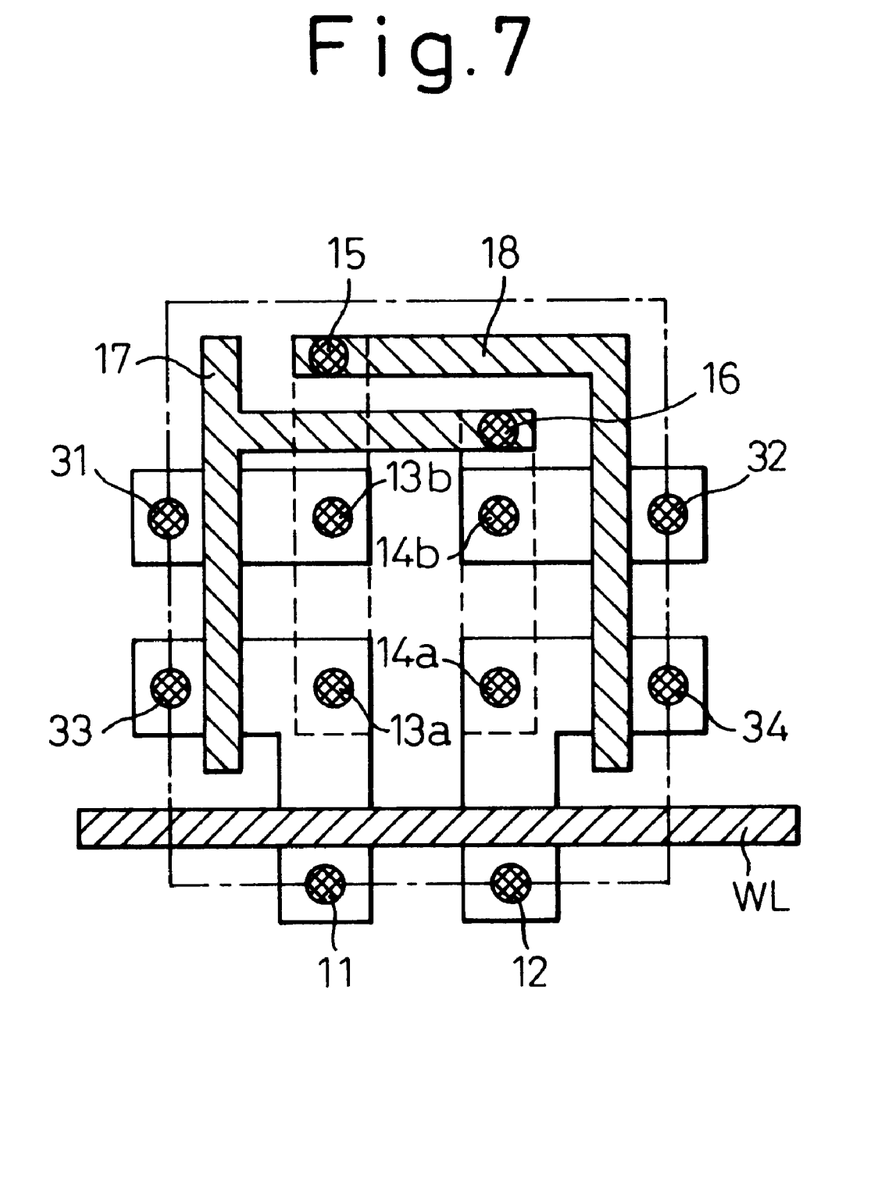
FIG. 7 is a diagram showing a layout for an SRAM in accordance with the third embodiment.

FIG. 7 is a diagram showing a layout for an SRAM in accordance with the third embodiment of the present invention. The layout for one memory cell is illustrated. The layout in accordance with the third embodiment will prove effective when the minimal spacing X between the diffused sources or drains of an n-channel transistor and p-channel transistor is made even smaller. The contact holes 15 and 16 used for cross-coupling are both located outside the diffused sources and drains of the n-channel transistors and p-channel transistors.

As described so far, according to the layout of the present invention, the size of a CMOS memory cell can be reduced. Consequently, the degree of integration of a static semiconductor memory can be improved, and the cost of manufacturing can be minimized.

What is claimed is:

1. A static semiconductor memory, comprising:
   CMOS memory cells each having two cross-coupled inverters, in each of which an n-channel transistor and a p-channel transistor are connected in series with each other,
   wherein gate lines each of which connects gates of said n-channel transistor and said p-channel transistor of each said cross-coupled inverter, respectively, have two portions, one of said two portions being a connection line connecting said gates of said n-channel transistor and said p-channel transistor of each said inverter, the other portion being an elongation expanding from said connection line in a substantially perpendicular direction to said connection line,
   wherein two contacts used to cross-couple said two inverters are located at ends of said elongations, and
   wherein at least one of said two contacts used to cross-couple said two inverters is located in any region other than a region enclosed by the diffused sources and drains of said n-channel transistor and p-channel transistors included in each memory cell.

2. A static semiconductor memory according to claim 1, wherein both the contacts used to cross-couple said two inverters are located in any region other than the region enclosed by the diffused sources and drains of said n-channel transistors and p-channel transistors.

3. A static semiconductor memory according to claim 1, wherein said memory cell and a memory cell made by turning said cross-coupled components of said memory cell 180° are arranged alternately in a column direction.

* * * * *